United States Patent [19]
Ohi

[11] Patent Number: 5,416,433
[45] Date of Patent: May 16, 1995

[54] INVERTING CIRCUIT

[75] Inventor: Susumu Ohi, Tokyo, Japan

[73] Assignee: NEC Corporation, Tokyo, Japan

[21] Appl. No.: 177,756

[22] Filed: Jan. 4, 1994

[30] Foreign Application Priority Data

Jan. 5, 1993 [JP] Japan .................. 5-000167

[51] Int. Cl.$^6$ ................ H03H 11/16; H03K 19/0175
[52] U.S. Cl. ...................... 327/73; 327/256
[58] Field of Search ............ 347/359, 261.2; 327/73, 327/256

[56] References Cited

FOREIGN PATENT DOCUMENTS 0102110 3/1984 European Pat. Off. .
0436384 7/1991 European Pat. Off. .

OTHER PUBLICATIONS

Patent Abstracts of Japan, vol. 11, No. 294, 22 Sep. 1987.
Patent Abstracts of Japan, vol. 14, No. 585, 27 Dec. 1990.

Primary Examiner—Margaret Rose Wambach
Attorney, Agent, or Firm—Sughrue, Mion, Zinn, Macpeak & Seas

[57] ABSTRACT

A data inverting circuit which operates stably at high speed without a negative-feedback loop includes operational amplifier 13 for generating, from inverting reference voltage VREF applied from an external source, a voltage which is twice the inverting reference voltage, and outputting the generated voltage between node N1 and ground line 4. Bipolar transistor Q1 has a base supplied with analog input signal VIN and a collector connected to resistor R6, which is connected to the emitter of transistor Q2 connected as a diode and having a base connected to node N1. The emitter of transistor Q1 is connected to ground line 4 through resistor R7 having the same resistance as resistor R6.

39 Claims, 3 Drawing Sheets

INVERTING CIRCUIT

BACKGROUND OF THE INVENTION

1. Field of the Invention

The present invention relates to a data inverting circuit, and more particularly to a data inverting circuit for producing, from an analog input signal whose voltage is higher (or lower) than a constant DC voltage (hereinafter referred to as an "inverting reference voltage"), an output signal having a waveform that is of symmetrical relationship to the waveform of the input signal with respect to the inverting reference voltage as a hypothetical axis of symmetry.

2. Description of the Related Art

Figure 1A:
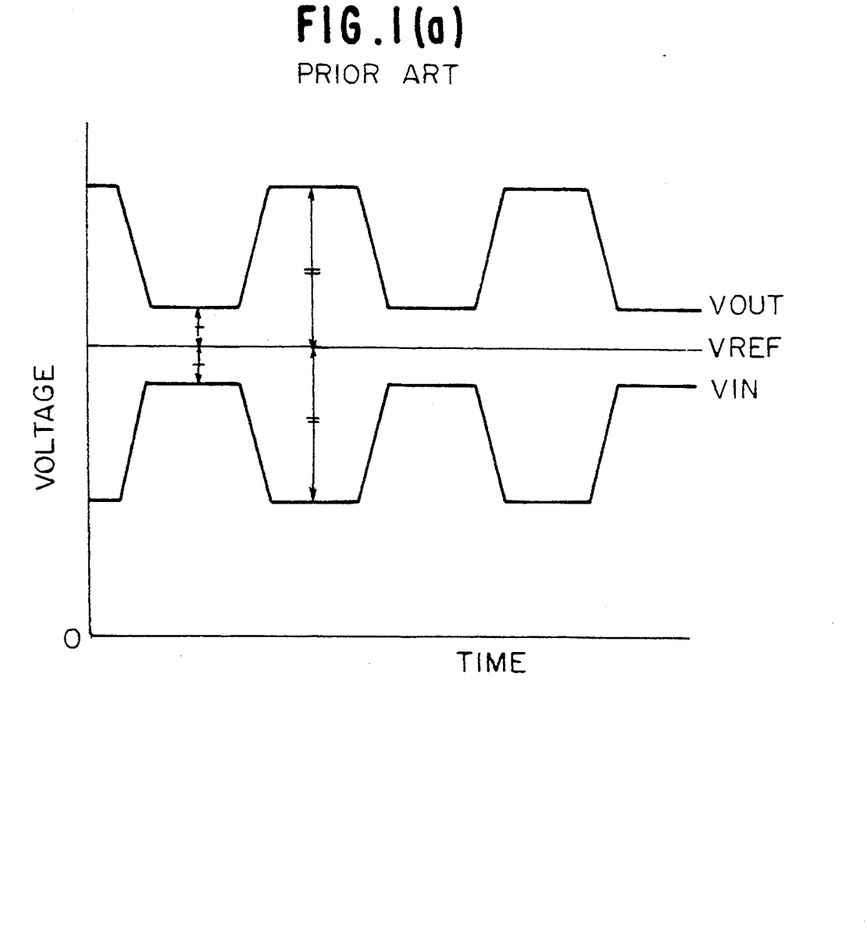
FIG. 1(a) is a diagram showing waveforms illustrative of the relationship between input and output signals of a data inverting circuit.

Data inverting circuits of the type described above are used, for example, to invert a voltage applied to a liquid crystal for preventing the liquid crystal from being charged in an analog full-color liquid crystal display unit. As shown in FIG. 1(a) of the accompanying drawings, the data inverting circuit produces, from high-frequency analog input signal VIN whose voltage is lower (or higher) than inverting reference voltage VREF, output signal VOUT having a waveform that is of symmetrical relationship to the waveform of input signal VIN with respect to inverting reference voltage VREF as a hypothetical axis of symmetry. The frequency of input signal VIN applied to the liquid crystal ranges from several tens of MHz to about hundred MHz. However, there is a demand for higher input signal frequencies as larger liquid crystal display units are desired.

Figure 1B:
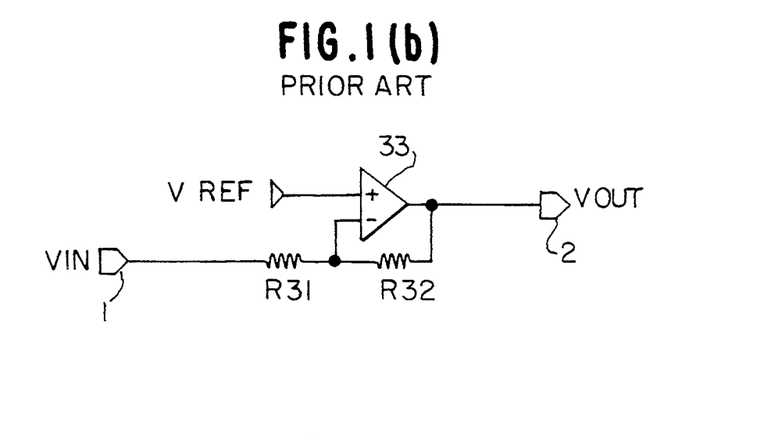
FIG. 1(b) is a circuit diagram of a conventional data inverting circuit comprising a resistor-feedback operational amplifier.

Heretofore, a negative-feedback operational amplifier as shown in FIG. 1(b) of the accompanying drawings has been used as such a data inverting circuit. As shown in FIG. 1(b), DC inverting reference voltage VREF is applied from an external source to a noninverting input terminal of operational amplifier 33, whose inverting input terminal is supplied with analog input signal VIN from input terminal 1 through resistor R31. Resistor R32 having the same resistance as that of resistor R31 is connected as a negative-feedback loop between the output terminal and the inverting input terminal of operational amplifier 33. The data inverting circuit produces an output signal VOUT from output terminal 2 connected to the output terminal of operational amplifier 33.

With the conventional data inverting circuit, the phase of output signal VOUT may change to a large extent due to the parasitic capacitance of feedback resistor R32. Since it is difficult to maintain a sufficient phase margin, the data inverting circuit may oscillate due to a positive feedback loop. Usually, the data inverting circuit is prevented from oscillating by inserting a phase-compensating capacitor (not shown). However, the phase-compensating capacitor delays the response of operational amplifier 33, which is thus unable to respond to quick input signals.

SUMMARY OF THE INVENTION

It is therefore an object of the present invention to provide a data inverting circuit capable of responding to input signals quickly without a negative-feedback loop.

According to the present invention, there is provided a data inverting circuit for producing, from an analog input signal whose voltage is lower or higher than a constant DC voltage, an output signal having a waveform which is of inverted relationship to the waveform of the analog input signal with respect to the constant DC voltage as an axis of symmetry, comprising a voltage doubling circuit for generating a DC voltage which is twice the constant DC voltage as the axis of symmetry from a DC voltage supplied from an external source, and outputting the generated DC voltage between two terminals, and a bipolar transistor having a base connected to an input terminal to which the analog input signal is supplied, a collector connected to one of the two terminals through a series-connected circuit of a first resistor and a circuit for generating a voltage equal to the base-to-emitter forward voltage of the bipolar transistor, such that the bipolar transistor is forward-biased, and an emitter connected to the other of the two terminals through a second resistor having the same resistance as the first resistor, the arrangement being such that an output signal of the data inverting circuit is produced from the collector of the bipolar transistor.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 2A:
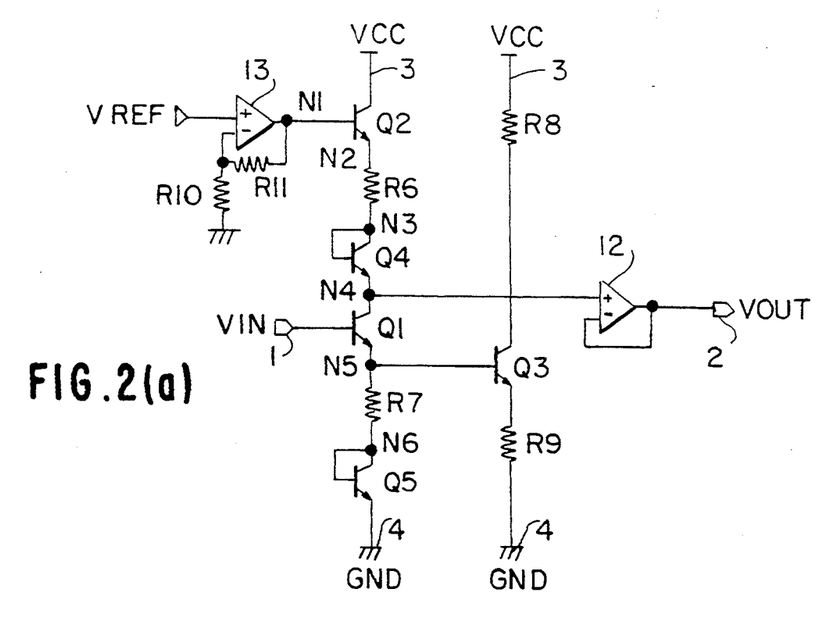
FIG. 2(a) is a circuit diagram of a data inverting circuit according to a first embodiment of the present invention.

As shown in FIG. 2(a), the data inverting circuit according to the first embodiment of the present invention includes npn bipolar transistor Q1 having a base which is supplied with analog input signal VIN that is applied from an external source. Supplied analog input signal VIN is inverted and outputted to the collector of transistor Q1. The inverted voltage outputted to the collector of transistor Q1 is supplied through voltage follower 12 as output signal VOUT to output terminal 2 connected to the output terminal thereof.

The data inverting circuit also has operational amplifier 13 for producing, from constant DC voltage (inverting reference voltage) VREF supplied from an external source, voltage 2VREF that is twice as high as inverting reference voltage VREF. Output voltage 2VREF from operational amplifier 13 is applied to the base of npn bipolar transistor Q2. Inverting reference voltage VREF is applied to a noninverting input terminal of operational amplifier 13 whose inverting input terminal is supplied with a voltage produced by resistors R10, R11 that divide the voltage from the output terminal of operational amplifier 13. Resistors R10, R11 have the same resistance for operational amplifier 13 to produce voltage 2VREF at its output terminal. Transistor Q2 produces at its emitter a voltage (2VREF−VF) which is equal to the difference between voltage 2VREF and base-to-emitter forward voltage VF of transistor Q2 (which is also equal to the base-to-emitter forward voltage of transistor Q1 as described below). The collector of transistor Q2 is connected to high-voltage power supply line 3.

Between the emitter of transistor Q2 and the collector of transistor Q1, there is connected a series-connected circuit of resistor R6 and npn bipolar transistor Q4 which is connected as a diode with the base and the collector coupled in common. A series-connected circuit of resistor R7 and npn bipolar transistor Q5 which is connected as a diode with the base and collector coupled in common is connected between the emitter of transistor Q1 and ground line 4.

The base of npn bipolar transistor Q3 is connected to the emitter of transistor Q1 in order to equalize currents flowing resistors R6 and R7. Transistor Q3 has an emitter connected to ground line 4 through resistor R9 and a collector to high-voltage power supply line 3 through resistor R8 which serves as a load.

Transistors Q1, Q2, Q3, Q4, Q5 have the same characteristics, i.e., the same base-to-emitter forward voltage VF. Resistors R6, R7, R9 have the same resistance.

Figure 2B:
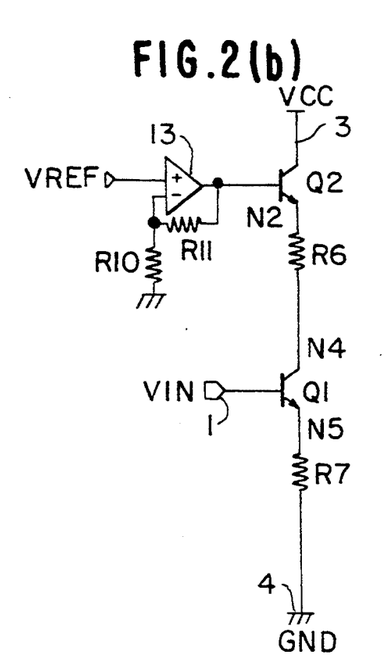
FIG. 2(b) is a circuit diagram illustrative of the manner in which the data inverting circuit shown in FIG. 2(a) operates to invert data.

Operation of the data inverting circuit according to the first embodiment will be described below with reference to FIGS. 2(b) and 2(c).

Figure 2C:
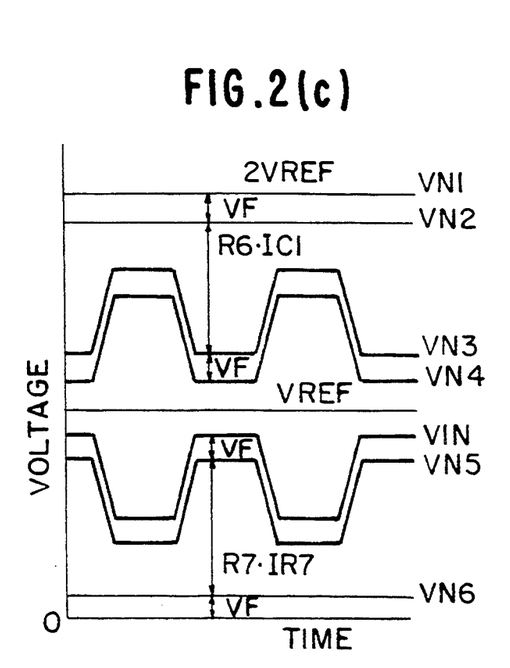
FIG. 2(c) is a timing chart of operation of the data inverting circuit shown in FIG. 2(a)

When input signal VIN having a waveform as shown in FIG. 2(c) is applied to the base of transistor Q1, voltage VN5 at node N5, i.e., at the emitter of transistor Q1, is in phase with input signal voltage VIN, but lower than input signal voltage VIN by base-to-emitter forward voltage VF of transistor Q1. Current IR7 flowing through resistor R7 and current IR9 flowing through resistor R9 are equal to each other as indicated by the following equation:

$$IR7 = IR9 = (VIN - 2VF)/R \quad (1)$$

As a result, base current IB1 of transistor Q1 and base current IB3 of transistor Q3 are substantially the same.

With respect to transistor Q1, collector current IC1, emitter current IE1, and base current IB1 have the following relationship:

$$IC1 = IE1 - IB1 \quad (2)$$

At node N5, the following relationship is satisfied:

$$IR7 = IE1 - IB3 \quad (3)$$

From equations (2), (3) and since IB1=IB3, current IR7 is equal to collector current IC1:

$$IR7 = IC1.$$

In this embodiment, therefore, the collector current of transistor Q1 and the current flowing through resistor R7 are substantially equal even when the base current of transistor Q1 varies.

Collector voltage VN4 of transistor Q1, which corresponds to output voltage VOUT, will be determined as follows: Voltage VN1 at node N1, i.e., at the output terminal of operational amplifier 13, is a constant voltage equal to voltage 2VREF that is twice inverting reference voltage VREF, as shown in FIG. 2(c). Therefore, voltage VN2 at node N2, i.e., at the emitter of transistor Q2, is a constant voltage indicated by:

$$VN2 = 2VREF - VF$$

as shown in FIG. 2(c).

Voltage VN4 at node N4, i.e., at the collector of transistor Q1 is a voltage produced by subtracting, from voltage VN2, a voltage drop across resistor R6 through which current IR6 flows and base-to-emitter forward voltage VF of transistor Q4, as indicated by:

$$VN4 = VN2 - RIR6 - VF = 2VREF - VF - RIR6 - VF \quad (4)$$

Current IR6 flowing through resistor R6 is the same as collector current IC1 of transistor Q1, i.e., current IR7 flowing through resistor R7. Therefore, using equation (1), equation (4) is modified as follows:

$$VN4 = 2VREF - 2VF - \{(VIN - 2VF)/R\}R = 2VREF - VIN.$$

Thus, the following relationship is satisfied:

$$(VN4 + VIN)/2 = VREF.$$

Consequently, voltage VN4 at node N4 is practically equal to a voltage that is produced by inverting input signal voltage VIN with respect to inverting reference voltage VREF which serves as the axis of symmetry. Voltage VN4 is applied to voltage follower 12 for impedance conversion, and outputted as output signal VOUT from output terminal 2.

It can be seen from the above operation that the data inverting function of the data inverting circuit according to this embodiment is achieved by a circuit composed of operational amplifier 13, two transistors Q2, Q1, and two resistors R6, R7. More specifically, as shown in FIG. 2(b), when input signal VIN is applied to the base of transistor Q1, it inverts input signal VIN and outputs the inverted signal to the collector thereof, i.e., to node N4. Since the resistance of resistor R6 connected to the collector of transistor Q1 and the resistance of resistor R7 connected to the emitter thereof are the same and the collector and emitter currents of transistor Q1 are substantially equal, the voltage drop across voltage R6 is equal to the voltage drop across voltage R7. As a consequence, voltage VN4 at node N4, which corresponds to output voltage VOUT, is lower than the voltage at node N2 by the voltage drop across resistor R6, and voltage VN5 at node N5 is higher than the ground potential by the voltage drop across resistor R7. Inasmuch as voltages VN4, VN5 are of mutually inverted waveforms and the voltage drops across resistors R6, R7 are equal, voltages VN4, VN5 are of mutually inverted relationship with respect to voltage (=VN2/2), as the axis of symmetry, which is ½ of the potential difference between node N2 and ground line 4. Therefore, when voltage 2VREF which is twice inverting reference voltage VREF is applied to node N2, voltages VN4, VN5 are rendered symmetrical with respect to inverting reference voltage VREF.

The symmetrical inverted relationship of input signal voltage VIN and voltage VN4 at node N4 is to be sought. As input signal voltage VIN is higher than voltage VN5 at node N5 by base-to-emitter forward voltage VF of transistor Q1, it is necessary to correct input signal voltage VIN with respect to voltage VN4, i.e., to lower voltage VN2 at node N2, serving as a reference for voltage VN4, by base-to-emitter forward voltage VF of transistor Q1. Transistor Q2 is inserted to thus correct input signal voltage VIN. Since the emitter of transistor Q2 is connected to node N2 and voltage 2VREF is applied to the base of transistor Q2, i.e., to node N1, voltage VN2 at node N2 becomes (2VREF−VF). Consequently, voltage VN4 and input signal voltage VIN are of symmetrically inverted relationship with respect to the axis of symmetry represented by inverting reference voltage VREF.

Since the data inverting circuit according to the above embodiment basically has no resistor-feedback loop, it does not suffer oscillation induced by a positive-feedback loop and an operation delay.

Because of inserted transistor Q3, the collector current of transistor Q1, which flows through resistor R6, and the current flowing through resistor R7 are equal in magnitude at all times even when the magnitude of the base current of transistor Q1 varies, thus compensating for changes in the base current of transistor Q1. It is thus possible to increase the base current of transistor Q1 to increase the speed of inverting operation of the data inverting circuit. The data inverting circuit is therefore suitable for high-speed operation. Transistor Q5 shown in FIG. 2 serves to equalize the potential difference between the opposite ends of resistor R7 with the potential difference between the opposite ends of resistor R9 when base-current-compensating transistor Q3 is inserted, i.e., to correct base-to-emitter forward voltage VF of transistor Q3 with respect to the emitter voltage of transistor Q1 to thereby equalize the currents flowing through resistors R7, R9 to equalize the base current of transistor Q1 with the base current of transistor Q3. Therefore, transistor Q5 and resistor R7 in their series-connected circuit shown in FIG. 2(a) may be switched around in position. Transistor Q4 connected as a diode between resistor R6 and the collector of transistor Q1 serves to increase the voltage at node N2 by an increase, corresponding to base-to-emitter forward voltage VF, caused in the voltage at node N5 due to connection of transistor Q5, to thereby correct the voltage at node N4. Therefore, transistor Q4 and resistor R6 in their series-connected circuit shown may also be switched around in position. Depending on the accuracy of symmetry between the input and output signals and the purpose for which the data inverting circuit is used, each of transistors Q2, Q4, Q5 shown in FIG. 2(a) may be replaced with a pn-junction diode.

In this embodiment, output signal voltage VOUT is represented by (2VREF−VIN) and does not depend on the base-to-emitter forward voltage of the transistor. Therefore, the data inverting circuit is more advantageous against temperature changes than the conventional data inverting circuit which employs a negative-feedback operational amplifier. Specifically, if voltage 2VREF is temperature-compensated, then output voltage VOUT is temperature-compensated in this embodiment. Since inverting reference voltage VREF is a constant DC voltage, it can be temperature-compensated with sufficient accuracy by employing temperature-compensating technology for reference voltages in large-scale semiconductor integrated circuits.

In the data inverting circuit shown in FIG. 2(a), the collector of transistor Q2 for generating voltage (2VREF−VF) from voltage 2VREF is connected to high-voltage power supply line 3. The base and collector of transistor Q2 may connected in common. Inasmuch as the voltage at node N2 is determined by the voltage at node N1, the voltage applied to the collector of transistor Q2 is not limited to the power supply voltage.

In the first embodiment described above, input signal VIN whose voltage is lower than inverting reference voltage VREF is inverted into output signal VOUT whose voltage is higher than inverting reference voltage VREF. However, as described below with reference to the second embodiment, input signal VIN whose voltage is higher than inverting reference voltage VREF may be inverted into output signal VOUT whose voltage is lower than inverting reference voltage VREF.

Figure 3A:
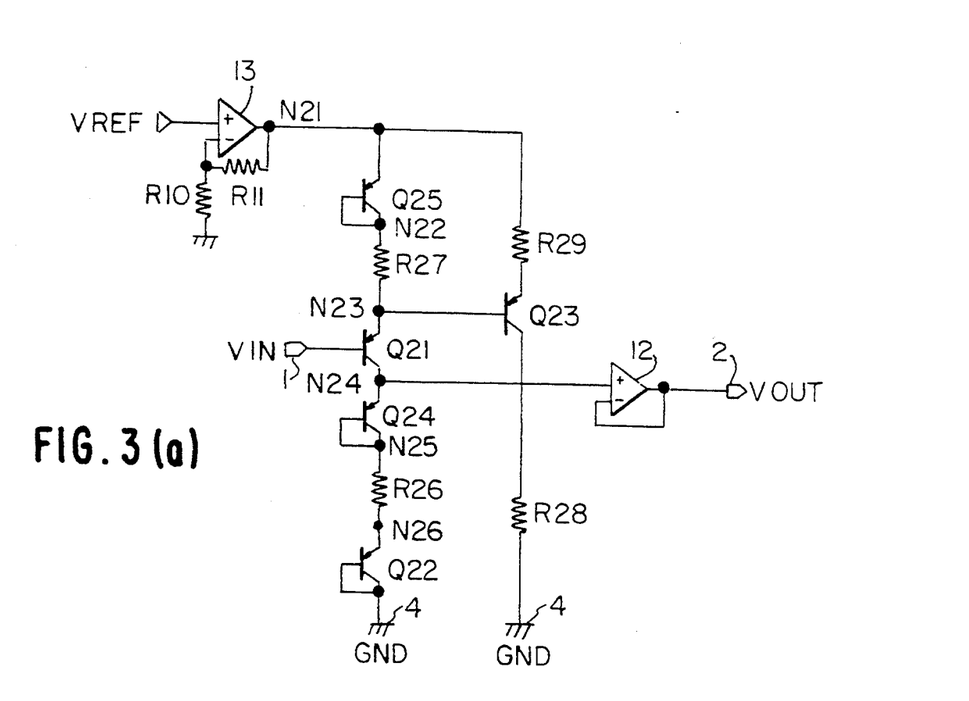
FIG. 3(a) is a circuit diagram of a data inverting circuit according to a second embodiment of the present invention.

FIG. 3(a) shows the data inverting circuit according to the second embodiment of the present invention. Those parts shown in FIG. 3(a) which are identical to those shown in FIG. 2(a) are denoted by identical reference characters. As shown in FIG. 3(a), analog input signal VIN that is applied from an external source to input terminal 1 is supplied to the base of pnp bipolar transistor Q21. Supplied analog input signal VIN is inverted and outputted to the collector of transistor Q21. The inverted voltage outputted to the collector of transistor Q21 is supplied through voltage follower 12 as output signal VOUT to output terminal 2 connected to the output terminal thereof.

The data inverting circuit also has pnp bipolar transistor Q22 which is connected as a diode with the base and collector coupled in common to ground line 4. Transistor Q22 serves to produce a voltage that is higher than the ground voltage by base-to-emitter forward voltage VF of transistor Q21. Between the emitter of transistor Q22 and the collector of transistor Q21, there is connected a series-connected circuit of resistor R26 and pnp bipolar transistor Q24 which is connected as a diode with the base and collector coupled in common. A series-connected circuit of resistor R27 and pnp bipolar transistor Q25 which is connected as a diode with the base and collector coupled in common is connected to the emitter of transistor Q21. The emitter of transistor Q25 is connected to the output terminal of operational amplifier 13.

The base of pnp bipolar transistor Q23 for equalizing a collector current of transistor Q21 with a current flowing through resistor R27 is connected to the emitter of transistor Q21. Transistor Q23 has a collector connected to ground line 4 through resistor R28 which serves as a load and an emitter to the output terminal of operational amplifier 13 through resistor R28.

Pnp bipolar transistors Q21, Q22, Q23, Q25, Q24 shown in FIG. 3(a) correspond respectively to transistor Q1 for inverting input signal VIN, transistor Q2 for generating the base-to-emitter forward voltage, transistor Q3 for compensating for changes in the base current, transistor Q5 for correcting the emitter voltage of transistor Q1, and transistor Q4 for correcting the collector voltage in the data inverting circuit according to the first embodiment. Resistors R26, R27, R28, R29 shown in FIG. 3(a) correspond respectively to resistors R6, R7, R8, R9 in the data inverting circuit according to the first embodiment.

Transistors Q21, Q22, Q23, Q24, Q25 have the same characteristics, i.e., the same base-to-emitter forward voltage VF. Resistors R26, R27, R29 have the same resistance.

Figure 3B:
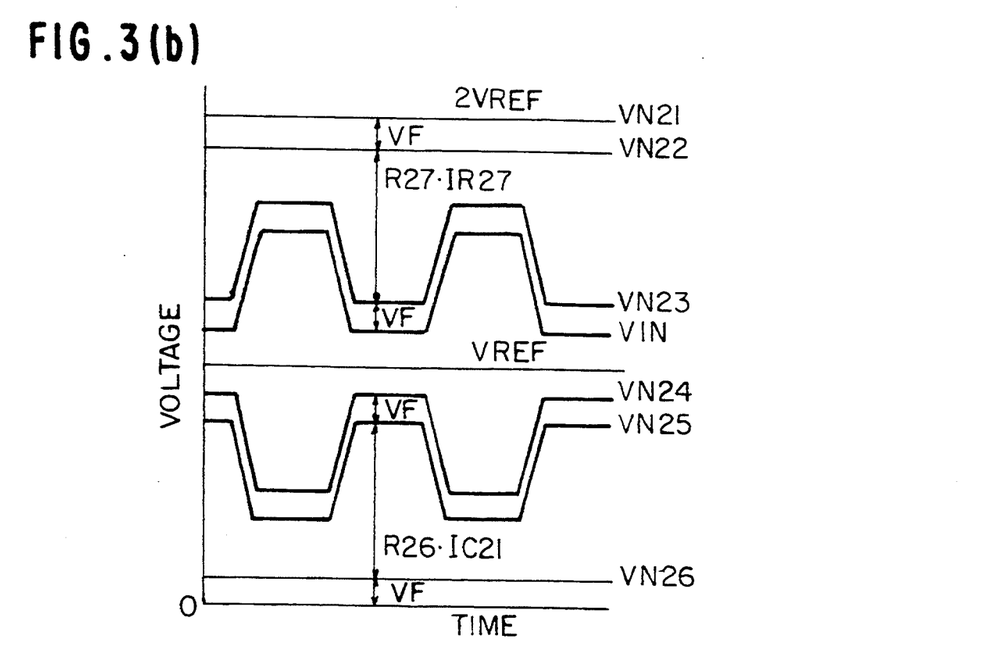
FIG. 3(b) is a timing chart of operation of the data inverting circuit shown in FIG. 3(a).

When input signal VIN whose voltage is higher than inverting reference voltage VREF as shown in FIG. 3(b) is applied to the base of transistor Q21, voltage VN23 at node N23, i.e., at the emitter of transistor Q21, is equal to (VIN+VF) as shown in FIG. 3(b), and the same current:

$$IR27 = IR28 = (2VREF - VIN - 2VF)/R$$

flows through resistors R27, R29. As a result, the base current of transistor Q21 and the base current of transistor Q23 are substantially the same.

Therefore, the collector current of transistor Q21 is substantially equal to the current flowing through resistor R27. Since the collector current of transistor Q21 flows through resistor R26, voltage VN24 at node N24 is expressed by:

$$VN24 = 2VF + \{(2VREF - VIN - 2VF)/R\}R = 2VREF - VIN.$$

Therefore, the following equation is satisfied:

$$(VN24 + VIN)/2 = VREF.$$

Consequently, voltage VN24 at node N24 is practically equal to a voltage that is produced by inverting input signal voltage VIN with respect to inverting reference voltage VREF. Voltage VN24 is impedance-converted by the voltage follower, and outputted as output signal VOUT from output terminal 2.

In the second embodiment, as can be seen from FIG. 3(b), voltage VN24 at node N24 is determined in reference to the voltage on ground line 4, and the voltage at node N23 which is related to input signal voltage VIN is determined in reference to the voltage at the output terminal of operational amplifier 13. As described above, transistor Q22 connected as a diode for correcting the base-to-emitter forward voltage is inserted between the collector of transistor Q21 and ground line 4. Therefore, the data inverting circuit according to the second embodiment is capable of symmetrically inverting input signal VIN whose voltage is higher than inverting reference voltage VREF into output signal VOUT whose voltage is lower than inverting reference voltage VREF.

In the first and second embodiments, the operational amplifier is employed as a circuit for producing voltage 2VREF which is twice inverting reference voltage VREF, and inverting reference voltage VREF is applied to the noninverting input terminal of the operational amplifier for comparison with a voltage which is half the the voltage at its output terminal. However, the voltage applied to the noninverting input terminal of the operational amplifier is not limited to inverting reference voltage VREF. If the voltage dividing ratio of a voltage divider for dividing the voltage at the output terminal of the operational amplifier is varied to adjust the ratio of the voltage applied to the noninverting input terminal of the operational amplifier to the voltage applied to the inverting input terminal thereof, then the operational amplifier can produce voltage 2VREF even when a voltage different from inverting reference voltage VREF is applied to the noninverting input terminal of the operational amplifier.

The data inverting circuit according to each of the first and second embodiments may be implemented as a one-chip integrated circuit with equal transistor and resistor characteristics for increased accuracy of symmetry between the input and output signals. In the case where the transistors are disposed close together and the resistors are disposed close together on the chip, any variations in their characteristics depending on the fabrication process are minimized for increased operation accuracy. If the chip is designed to orient the transistors and the resistors in one direction, any differences between their characteristics depending on the crystal direction (anisotropy) are reduced to make the data inverting circuit highly accurate.

According to the present invention, as described above, a voltage which is twice the inverting reference voltage applied from an external source is produced from the inverting reference voltage and outputted between two terminals. The collector of a data-inverting bipolar transistor whose base is supplied with an analog input signal is connected to one of the two terminals through a series-connected circuit of a resistor and a circuit for generating a voltage equal to the base-to-emitter forward voltage of the bipolar transistor, such that the bipolar transistor is forward-biased. The emitter of the bipolar transistor is connected to the other terminal through a resistor having the same resistance as the above resistor, with an output signal being produced from the collector of the bipolar transistor.

Consequently, the data inverting circuit according to the present invention can produce an output signal by inverting an analog input signal whose voltage is lower (or higher) than a constant DC voltage with respect to a hypothetical axis of symmetry which is represented by the constant DC voltage, without employing a resistor-feedback loop. The data inverting circuit is free of oscillation due to a negative-feedback loop, and operates at high speed without a delay in operation.

Furthermore, the data inverting circuit includes a transistor for compensating for changes in the base current of the data-inverting bipolar transistor to keep the input and output signals symmetrical irrespective of the magnitude of the base current. As a result, the data inverting circuit can invert data with increased accuracy. The data inverting circuit also allows the base current of the data-inverting bipolar transistor to increase for operation at higher speed for data inversion.

Inasmuch as the output signal is converted into an output signal for a lower impedance by the voltage follower, the data inverting circuit imposes no limitations on the input characteristics of a circuit connected next to the data inverting circuit.

Although certain preferred embodiments of the present invention has been shown and described in detail, it should be understood that various changes and modifications may be made therein without departing from the scope of the appended claims.

What is claimed is:

1. A data inverting circuit for producing, from an analog input signal whose voltage is lower or higher than a constant DC voltage, an output signal having a waveform which is of inverted relationship to the waveform of the analog input signal with respect to the constant DC voltage as an axis of symmetry, comprising:

a voltage doubling circuit for generating a DC voltage which is twice the constant DC voltage as the axis of symmetry from a DC voltage supplied from an external source, and outputting the generated DC voltage between two terminals; and a bipolar transistor having a base connected to an input terminal to which the analog input signal is supplied, a collector connected to one of said two terminals through a series-connected circuit of a first resistor and a circuit for generating a voltage equal to the base-to-emitter forward voltage of said bipolar transistor, such that the bipolar transistor is forward-biased, and an emitter connected to the other of said two terminals through a second resistor having the same resistance as said first resistor;

the arrangement being such that an output signal of the data inverting circuit is produced from the collector of said bipolar transistor.

2. A data inverting circuit for producing, from an analog input signal whose voltage is lower than a constant DC voltage, an output signal having a waveform which is of inverted relationship to the waveform of the analog input signal with respect to the constant DC voltage as an axis of symmetry, comprising:

an npn output bipolar transistor having a base for being supplied with the analog input signal;

a voltage doubling circuit for generating a DC voltage which is twice the inverting reference voltage as the axis of symmetry from a DC voltage supplied from an external source;

a constant-voltage generating circuit for generating, from said DC voltage generated by said voltage doubling circuit, a constant voltage which is lower than the DC voltage generated by said voltage doubling circuit by a voltage equal to the base-to-emitter voltage of said output bipolar transistor;

a first resistor connected between an output terminal of said constant-voltage generating circuit and the collector of said output bipolar transistor; and a second resistor connected between a ground terminal and the emitter of said output bipolar transistor, said second resistor having the same resistance as said first resistor;

the arrangement being such that an output signal of the data inverting circuit is produced from the collector of said output bipolar transistor.

3. A data inverting circuit according to claim 2, wherein said voltage doubling circuit comprises an operational amplifier having a noninverting input terminal for being supplied with said inverting reference voltage and an inverting input terminal for being supplied with a voltage which is half the voltage at an output terminal thereof, and said constant-voltage generating circuit comprises an npn bipolar transistor having a base for being supplied with the voltage generated by said voltage doubling circuit and an emitter for outputting the constant voltage.

4. A data inverting circuit according to claim 3, further including a voltage follower for transmitting therethrough the output signal from the collector of said output bipolar transistor.

5. A data inverting circuit according to claim 4, wherein said npn output bipolar transistor, said npn bipolar transistor of said constant-voltage generating circuit, said first resistor, and said second resistor have the same transistor and resistor characteristics, respectively, and are disposed closely together and oriented in one direction on one semiconductor substrate.

6. A data inverting circuit according to claim 5, wherein said voltage doubling circuit further comprises:

a resistor pair, one resistor of said resistor pair being connected between a ground terminal and said inverting input terminal and the other resistor of said resistor pair connected between said inverting input terminal and said output terminal, said resistor pair being formed on a semiconductor substrate with said first resistor and said second resistor of the data inverting circuit, all of said resistors having substantially the same resistor characteristics and disposed closely together and all oriented in one direction.

7. A data inverting circuit according to claim 3, further comprising:

a base-current-compensating npn bipolar transistor having a base connected to the emitter of said output bipolar transistor and an emitter connected to said ground terminal through a third resistor having the same resistance as said first and second resistors;

a collector-voltage-correcting npn diode connected in series with said first resistor; and an emitter-voltage-correcting npn diode connected in series with said second resistor.

8. A data inverting circuit according to claim 7, further including a voltage follower for transmitting therethrough the output signal from the collector of said output bipolar transistor.

9. A data inverting circuit according to claim 8, wherein said npn output bipolar transistor, said npn bipolar transistor of said constant-voltage generating circuit, said base-current-compensating npn bipolar transistor, said collector-voltage-correcting npn diode, said emitter-voltage-correcting npn diode, wherein each of said npn diodes being a diode connected transistor, and said first resistor, said second resistor, and said third resistor have the same transistor and resistor characteristics, respectively, and are disposed closely together and oriented in one direction on one semiconductor substrate.

10. A data inverting circuit according to claim 9, wherein said voltage doubling circuit further comprises:

a resistor pair, one resistor of said resistor pair being connected between a ground terminal and said inverting input terminal and the other resistor of said resistor pair connected between said inverting input terminal and said output terminal, said resistor pair being formed on a semiconductor substrate with said first resistor, said second resistor, and said third resistor of the data inverting circuit, all of said resistors having substantially the same resistor characteristics and disposed closely together and all oriented in one direction.

11. A data inverting circuit according to claim 2, further comprising:

a base-current-compensating npn bipolar transistor having a base connected to the emitter of said output bipolar transistor and an emitter connected to said ground terminal through a third resistor having the same resistance as said first and second resistors;

a collector-voltage-correcting npn diode connected in series with said first resistor; and an emitter-voltage-correcting npn diode connected in series with said second resistor.

12. A data inverting circuit according to claim 11, further including a voltage follower for transmitting therethrough the output signal from the collector of said output bipolar transistor.

13. A data inverting circuit according to claim 12, wherein said npn output bipolar transistor, said base-current-compensating npn bipolar transistor, said collector-voltage-correcting npn diode, said emitter-voltage-correcting npn diode, wherein each of said npn diodes being a diode connected transistor, and said first resistor, said second resistor, and said third resistor have the same transistor and resistor characteristics, respectively, and are disposed closely together and oriented in one direction on one semiconductor substrate.

14. A data inverting circuit according to claim 13, wherein said voltage doubling circuit comprises:
   an operational amplified amplifier having a noninverting input terminal for being supplied with said inverting reference voltage and an inverting input terminal for being supplied with a voltage which is half the voltage at an output terminal thereof;
   a resistor pair, one resistor of said resistor pair being connected between a ground terminal and said inverting input terminal and the other resistor of said resistor pair connected between said inverting input terminal and said output terminal, said resistor pair being formed on a semiconductor substrate with said first resistor, said second resistor, and said third resistor of the data inverting circuit, all of said resistors having substantially the same resistor characteristics and disposed closely together and all oriented in one direction.

15. A data inverting circuit according to claim 2, further including a voltage follower for transmitting therethrough the output signal from the collector of said output bipolar transistor.

16. A data inverting circuit according to claim 15, wherein said first resistor and said second resistor have the same resistor characteristics and are disposed closely together and oriented in one direction on one semiconductor substrate.

17. A data inverting circuit according to claim 16, wherein said voltage doubling circuit comprises:
   an operational amplifier having a noninverting input terminal for being supplied with said inverting reference voltage and an inverting input terminal for being supplied with a voltage which is half the voltage at an output terminal thereof;
   a resistor pair, one resistor of said resistor pair being connected between a ground terminal and said inverting input terminal and the other resistor of said resistor pair connected between said inverting input terminal and said output terminal, said resistor pair being formed on a semiconductor substrate with said first resistor and said second resistor of the data inverting circuit, all of said resistors having substantially the same resistor characteristics and disposed closely together and all oriented in one direction.

18. A data inverting circuit comprising:
   an npn output bipolar transistor having a base for being supplied with an analog input signal;
   an operational amplifier having a noninverting input terminal for being supplied with a DC voltage from an external source and an inverting input terminal for being supplied with a voltage which is half the voltage at an output terminal thereof;
   a constant-voltage generating circuit comprising an npn bipolar transistor having a base connected to an output terminal of said operational amplifier and a collector connected to a constant-voltage source;
   a first resistor having one terminal connected to the emitter of the bipolar transistor of said constant-voltage generating circuit;
   a collector-voltage-correcting npn bipolar transistor having a base and a collector connected in common to the other terminal of said first resistor, and an emitter connected to the collector of said output bipolar transistor;
   a second resistor having one terminal connected to the emitter of the output bipolar transistor, said second resistor having the same resistance as said first resistor;
   an emitter-voltage-correcting npn bipolar transistor having a base and a collector connected in common to the other terminal of said second resistor, and an emitter connected to a ground terminal; and
   a base-current-correcting npn bipolar transistor having a base connected to the emitter of said output bipolar transistor, a collector connected to said constant-voltage source through a load, and an emitter connected to said ground terminal through a third resistor having the same resistance as said first and second resistors; and
   a voltage follower for being supplied with a voltage from the collector of said output bipolar transistor and producing an output signal from an output terminal thereof.

19. A data inverting circuit according to claim 18, wherein said npn output bipolar transistor, said npn bipolar transistor of said constant-voltage generating circuit, said base-current-correcting npn bipolar transistor, said emitter-voltage-correcting npn bipolar transistor, said collector-voltage-correcting npn bipolar transistor, said first resistor, said second resistor, and said third resistor have the same transistor and resistor characteristics, respectively, and are disposed closely together and oriented in one direction on one semiconductor substrate.

20. A data inverting circuit according to claim 19, further comprising:
   a resistor pair, one resistor of said resistor pair being connected between a ground terminal and said inverting input terminal of said operational amplifier and the other resistor of said resistor pair connected between said inverting input terminal of said operational amplifier and said output terminal of said operational amplifier, said resistor pair being formed on a semiconductor substrate with said first resistor, said second resistor, and said third resistor of the data inverting circuit, all of said resistors having substantially the same resistor characteristics and disposed closely together and all oriented in one direction.

21. A data inverting circuit comprising:
   a pnp output bipolar transistor having a base for being supplied with an analog input signal;
   an operational amplifier having a noninverting input terminal for being supplied with a DC voltage from an external source and an inverting input terminal for being supplied with a voltage which is half the voltage at an output terminal thereof;
   a constant-voltage generating circuit comprising a pnp bipolar transistor having a base and a collector connected in common to a ground terminal;

a first resistor having one terminal connected to the emitter of the bipolar transistor of said constant-voltage generating circuit;

a collector-voltage-correcting pnp bipolar transistor having a base and a collector connected in common to the other terminal of said first resistor, and an emitter connected to the collector of said output bipolar transistor;

a second resistor having one terminal connected to the emitter of the output bipolar transistor, said second resistor having the same resistance as said first resistor;

an emitter-voltage-correcting pnp bipolar transistor having a base and a collector connected in common to the other terminal of said second resistor, and an emitter connected to the output terminal of said operational amplifier; and a base-current-correcting pnp bipolar transistor having a base connected to the emitter of said output bipolar transistor, a collector connected to said ground terminal through a load, and an emitter connected to the output terminal of said operational amplifier through a third resistor having the same resistance as said first and second resistors; and a voltage follower for being supplied with a voltage from the collector of said output bipolar transistor and producing an output signal from an output terminal thereof.

22. A data inverting circuit according to claim 21, wherein said pnp output bipolar transistor, said pnp bipolar transistor of said constant-voltage generating circuit, said base-current-correcting pnp bipolar transistor, said emitter-voltage-correcting pnp bipolar transistor, said collector-voltage-correcting pnp bipolar transistor, said first resistor, said second resistor, and said third resistor have the same transistor and resistor characteristics, respectively, and are disposed closely together and oriented in one direction on one semiconductor substrate.

23. A data inverting circuit according to claim 22, further comprising:

a resistor pair, one resistor of said resistor pair being connected between a ground terminal and said inverting input terminal of said operational amplifier and the other resistor of said resistor pair connected between said inverting input terminal of said operational amplifier and said output terminal of said operational amplifier, said resistor pair being formed on a semiconductor substrate with said first resistor, said second resistor, and said third resistor of the data inverting circuit, all of said resistors having substantially the same resistor characteristics and disposed closely together and all oriented in one direction.

24. A data inverting circuit for producing, from an analog input signal whose voltage is higher than a constant DC voltage, an output signal having a waveform which is of inverted relationship to the waveform of the analog input signal with respect to the constant DC voltage as an axis of symmetry, comprising:

a pnp output bipolar transistor having a base for being supplied with the analog input signal;

a voltage doubling circuit for generating a DC voltage which is twice the inverting reference voltage as the axis of symmetry from a DC voltage supplied from an external source;

a constant-voltage generating circuit for generating a constant voltage which is higher than the ground voltage by a voltage equal to the base-to-emitter voltage of said output bipolar transistor;

a first resistor connected between an output terminal of said constant-voltage generating circuit and the collector of said output bipolar transistor; and a second resistor connected between an output terminal of said voltage doubling circuit and the emitter of said output bipolar transistor, said second resistor having the same resistance as said first resistor;

the arrangement being such that an output signal of the data inverting circuit is produced from the collector of said output bipolar transistor.

25. A data inverting circuit according to claim 24, wherein said voltage doubling circuit comprises an operational amplifier having a noninverting input terminal for being supplied with said inverting reference voltage and an inverting input terminal for being supplied with a voltage which is half the voltage at an output terminal thereof, and said constant-voltage generating circuit comprises a pnp bipolar transistor connected as a diode with a base and a collector thereof coupled to each other, and having an emitter for outputting the constant voltage.

26. A data inverting circuit according to claim 25, further including a voltage follower for transmitting therethrough the output signal from the collector of said output bipolar transistor.

27. A data inverting circuit according to claim 26, wherein said pnp output bipolar transistor, said pnp bipolar transistor of said constant-voltage generating circuit, said first resistor, and said second resistor have the same transistor and resistor characteristics, respectively, and are disposed closely together and oriented in one direction on one semiconductor substrate.

28. A data inverting circuit according to claim 27, wherein said voltage doubling circuit further comprises:

a resistor pair, one resistor of said resistor pair being connected between a ground terminal and said inverting input terminal and the other resistor of said resistor pair connected between said inverting input terminal and said output terminal, said resistor pair being formed on a semiconductor substrate with said first resistor and said second resistor of the data inverting circuit, all of said resistors having substantially the same resistor characteristics and disposed closely together and all oriented in one direction.

29. A data inverting circuit according to claim 25, further comprising:

a base-current-compensating pnp bipolar transistor having a base connected to the emitter of said output bipolar transistor and an emitter connected to the output terminal of said voltage doubling circuit through a third resistor having the same resistance as said first and second resistors;

a collector-voltage-correcting pnp diode connected in series with said first resistor; and an emitter-voltage-correcting pnp diode connected in series with said second resistor.

30. A data inverting circuit according to claim 29, further including a voltage follower for transmitting therethrough the output signal from the collector of said output bipolar transistor.

31. A data inverting circuit according to claim 30, wherein said pnp output bipolar transistor, said pnp bipolar transistor of said constant-voltage generating circuit, said base-current-compensating pnp bipolar transistor, said emitter-voltage-correcting pnp diode, said collector-voltage-correcting pnp diode, wherein each of said pnp diodes being a diode connected transistor, and said first resistor, said second resistor, and said third resistor have the same transistor and resistor characteristics, respectively, and are disposed closely together and oriented in one direction on one semiconductor substrate.

32. A data inverting circuit according to claim 31, wherein said voltage doubling circuit further comprises:

a resistor pair, one resistor of said resistor pair being connected between a ground terminal and said inverting input terminal and the other resistor of said resistor pair connected between said inverting input terminal and said output terminal, said resistor pair being formed on a semiconductor substrate with said first resistor, said second resistor, and said third resistor of the data inverting circuit, all of said resistors having substantially the same resistor characteristics and disposed closely together and all oriented in one direction.

33. A data inverting circuit according to claim further comprising:

a base-current-compensating pnp bipolar transistor having a base connected to the emitter of said output bipolar transistor and an emitter connected to the output terminal of said voltage doubling circuit through a third resistor having the same resistance as said first and second resistors;

a collector-voltage-correcting pnp diode connected in series with said first resistor; and an emitter-voltage-correcting pnp diode connected in series with said second resistor.

34. A data inverting circuit according to claim 33, further including a voltage follower for transmitting therethrough the output signal from the collector of said output bipolar transistor.

35. A data inverting circuit according to claim 34, wherein said pnp output bipolar transistor, said base-current-compensating pnp bipolar transistor, said emitter-voltage-correcting pnp diode, said collector-voltage-correcting pnp diode, wherein each of said pnp diodes being a diode connected transistor, and said first resistor, said second resistor, and said third resistor have the same transistor and resistor characteristics, respectively, and are disposed closely together and oriented in one direction on one semiconductor substrate.

36. A data inverting circuit according to claim 35, wherein said voltage doubling circuit comprises:

an operational amplified amplifier having a noninverting input terminal for being supplied with said inverting reference voltage and an inverting input terminal for being supplied with a voltage which is half the voltage at an output terminal thereof;

a resistor pair, one resistor of said resistor pair being connected between a ground terminal and said inverting input terminal and the other resistor of said resistor pair connected between said inverting input terminal and said output terminal, said resistor pair being formed on a semiconductor substrate with said first resistor, said second resistor, and said third resistor of the data inverting circuit, all of said resistors having substantially the same resistor characteristics and disposed closely together and all oriented in one direction.

37. A data inverting circuit according to claim 24, further including a voltage follower for transmitting therethrough the output signal from the collector of said output bipolar transistor.

38. A data inverting circuit according to claim 37, wherein said first resistor and said second resistor have the same resistor characteristics and are disposed closely together and oriented in one direction on one semiconductor substrate.

39. A data inverting circuit according to claim 38, wherein said voltage doubling circuit comprises:

an operational amplified amplifier having a noninverting input terminal for being supplied with said inverting reference voltage and an inverting input terminal for being supplied with a voltage which is half the voltage at an output terminal thereof;

a resistor pair, one resistor of said resistor pair being connected between a ground terminal and said inverting input terminal and the other resistor of said resistor pair connected between said inverting input terminal and said output terminal, said resistor pair being formed on a semiconductor substrate with said first resistor and said second resistor of the data inverting circuit, all of said resistors having substantially the same resistor characteristics and disposed closely together and all oriented in one direction.

* * * * *